United States Patent
Deokar et al.

(10) Patent No.: US 9,335,877 B1
(45) Date of Patent: May 10, 2016

(54) USER INTERFACE FOR ELECTRONIC DEVICES AND METHODS THEREFOR

(71) Applicant: MOTOROLA MOBILITY LLC, Libertyville, IL (US)

(72) Inventors: Itisha C. Deokar, Buffalo Grove, IL (US); Chris J. Grivas, Crystal Lake, IL (US); Mitchell J. Hodges, Plainfield, IL (US); Daniel P. Rodgers, Arlington Heights, IL (US)

(73) Assignee: GOOGLE TECHNOLOGY HOLDINGS LLC

( * ) Notice: Subject to any disclaimer, the term of this patent is extended or adjusted under 35 U.S.C. 154(b) by 0 days.

(21) Appl. No.: 14/475,131

(22) Filed: Sep. 2, 2014

Related U.S. Application Data

(62) Division of application No. 13/611,682, filed on Sep. 12, 2012, now Pat. No. 8,854,309.

(51) Int. Cl.
  *G06F 3/044* (2006.01)
  *G06F 3/01* (2006.01)
  *G06F 3/0488* (2013.01)

(52) U.S. Cl.
  CPC ............. *G06F 3/044* (2013.01); *G06F 3/016* (2013.01); *G06F 3/04886* (2013.01)

(58) Field of Classification Search
  CPC ... G06F 3/04886; G06F 3/016; G06F 1/1684; G06F 1/1669; G06F 3/044; H03K 2217/96038
  USPC ............ 345/156, 168, 169, 173, 174; 341/22, 341/32; 200/5 A, 5 R, 512; 340/407.1, 340/407.2; 400/472, 479; 361/679.08, 361/679.15, 679.17
  See application file for complete search history.

(56) References Cited

U.S. PATENT DOCUMENTS

| | | | | |
|---|---|---|---|---|
| 6,108,200 | A * | 8/2000 | Fullerton | G06F 1/1632 235/145 R |
| 6,515,852 | B2 * | 2/2003 | Huang | G06F 1/1626 235/145 R |
| 2010/0090716 | A1 | 4/2010 | Steedman et al. | |
| 2010/0090717 | A1 | 4/2010 | Steedman et al. | |
| 2010/0265190 | A1 | 10/2010 | Rofougaran | |
| 2010/0265203 | A1 | 10/2010 | Rofougaran | |
| 2012/0169603 | A1 | 7/2012 | Peterson et al. | |
| 2012/0242464 | A1 | 9/2012 | Maier et al. | |

OTHER PUBLICATIONS

Microchip MCP2036, "Inductive Sensor Analog Front End Device", Microchip Technology Inc. 2009, DS22186A, all pages.
Notice of Allowance for U.S. Appl. No. 13/611,682, mailed Jun. 2, 2014, 11 pages.

* cited by examiner

*Primary Examiner* — Koosha Sharifi-Tafreshi
(74) *Attorney, Agent, or Firm* — Brake Hughes Bellerman LLP

(57) ABSTRACT

A user interface (301) comprises a layered structure defining one or more keys (302,303,304). The layers can include a top layer (331), a base layer (335), and an interior layer (332) disposed therebetween. One or more layers are pliant and can be compressed. Magnetically permeable materials (308,309) form a closed loop (310). A corresponding coil (311) is operable with the loop. Electrical properties of the closed loop change in response to user input. A control unit (312) is then configured to detect a change in the electrical properties when the pliant material is compressed. Where the change is greater than a predefined threshold, the control unit (312) discharges an energy storage device into the coil to provide a haptic response (109).

11 Claims, 8 Drawing Sheets

USER INTERFACE FOR ELECTRONIC DEVICES AND METHODS THEREFOR

CROSS-REFERENCE TO RELATED APPLICATION

This application is a Divisional of, and claims priority to, U.S. patent application Ser. No. 13/611,682, filed on Sep. 12, 2012, entitled "USER INTERFACE FOR ELECTRONIC DEVICES AND METHODS THEREFOR", the disclosure of which is incorporated by reference herein in its entirety.

BACKGROUND

1. Technical Field

This invention relates generally to electronic devices, and more particularly to user interfaces for electronic devices.

2. Background Art

Compact portable electronic devices are becoming increasingly popular. As more and more users carry these electronic devices, manufacturers are designing smaller devices with increased functionality. By way of example, not too long ago a mobile telephone was a relatively large device, and its only function was that of making telephone calls. Today, however, mobile telephones fit easily in a shirt pocket and often include numerous "non-phone" features such as cameras, video recorders, games, web browsers, and music players.

Just as the feature set included with compact portable electronic devices has become more sophisticated, so too has the hardware itself. Most portable electronic devices of the past included only manually operated buttons. Today, however, manufacturers are building devices with "touch sensitive" screens and user interfaces that include no physical buttons or keys. Instead of pressing a button, the user touches "virtual buttons" presented on the display to interact with the device.

Despite the convenience and flexibility of these devices, many users today still prefer the familiarity of a more classic user interface. Some find the non-responsive touch screen user interfaces cumbersome to operate and prefer, for example, a more traditional keyboard. While some electronic devices allow a conventional keyboard to be coupled as a user interface, prior art keyboard technology results in large form-factor designs. Users generally do not want to carry large keyboards along with their compact electronic device. As a result, such keyboards are relegated to limited usage. It would be advantageous to have an improved user input device.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
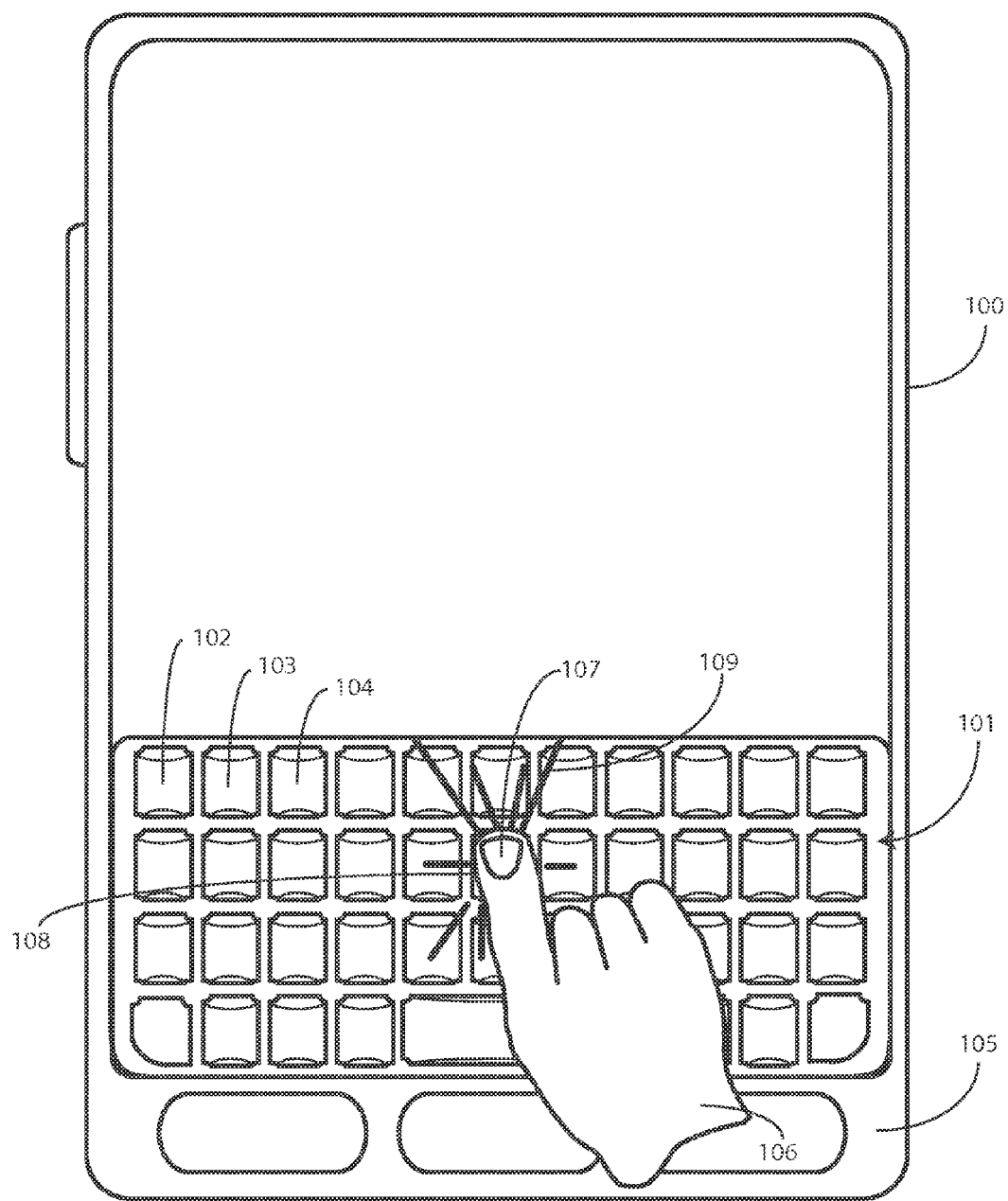
FIG. 1 illustrates one embodiment of an electronic device having an explanatory user input device configured in accordance with one or more embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EMBODIMENTS OF THE INVENTION

It should be observed that the embodiments described above reside primarily in combinations of method steps and apparatus components related to operating a user input device structure having multiple layers, a coil corresponding to user input locations, and a magnetically permeable material for both sensing user input and delivering a haptic response when driven by the coil. Any process descriptions or blocks in flow charts should be understood as representing modules, segments, or portions of code that include one or more executable instructions for implementing specific logical functions or steps in the process. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

It will be appreciated that embodiments of the invention described herein may be comprised of one or more conventional processors and unique stored program instructions that control the one or more processors to implement, in conjunction with certain non-processor circuits, some, most, or all of the functions of the user interface embodiments described herein. As such, these functions may be interpreted as steps of a method to sense user input, operate a user interface, and/or deliver haptic feedback through a user interface. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in a figure other than figure A.

Various embodiments describe and illustrate a compact user interface, suitable for use with an electronic device or a peripheral device that is operable with an electronic device, which provides a more traditional "legacy" keyboard feel. Embodiments include an electromechanical user interface design that can both sense user input and deliver tactile feedback similar to that of a conventional keypad or keyboard while maintaining a very slim form factor that is suitable for use with modern, compact, electronic devices. In short, embodiments described below provide a conventional user interface experience with an interface peripheral that is very thin, simple, and compact.

In one embodiment, a user interface for an electronic device includes a layered structure defining one or more keys. The layered structure includes at least a top layer, a base layer, and an interior layer that is disposed between the top layer and the base layer. Using magnetic fields to both sense user input and deliver the haptic feedback, a magnetically permeable path is defined by magnetically permeable material that is selectively disposed in each of the top layer, the base layer, and the interior layer. A substrate layer, disposed between the top layer and the base layer, then includes electrical conductors that define a coil corresponding to each user interface target on the device. For example, if the device is configured as a conventional QWERTY keypad, each of the "keys" on the device would have a coil corresponding thereto.

One of the layers in the structure can be manufactured as a pliant layer. For example, in one explanatory embodiment, the interior layer is configured as a thermoplastic polyurethane layer that can compress and relax between the top layer and the base layer. Additionally, one of the layers in the structure can be designed so as to define an air pocket beneath each one of the user actuation targets. Illustrating by example, in one explanatory embodiment the interior layer defines a plurality of apertures, with each aperture corresponding to a user actuation target. Thus, if the device is configured as a conventional QWERTY keypad, an air gap established by an aperture would correspond to each individual "key."

The coil of the substrate layer, working in tandem with the magnetically permeable path defined by the magnetically permeable material disposed in the other layers, defines an inductance. When a user applies a force to a user actuation target, the pliant layer compresses, thereby changing the length of the magnetically permeable path by altering the volume of the air gap. A control circuit, operable with the coil, is configured to sense this change in path length by sensing a change in inductance. Once this change is greater than a predetermined threshold, the control circuit determines the change as being in response to user input.

To provide a true haptic response, upon detecting the user input, the control circuit then closes a switch between an energy storage device—one example of which is a capacitor—that is selectively operable with the coil. The closing of this switch causes energy stored in the energy storage device discharge into the coil, which induces a magnetic field in the magnetically permeable path. This field then causes a sudden compression of the air gap and pliant layer by solenoid action to provide a tactile "click" back to the user. Once the tactile response has been delivered, the control circuit can open the switch, thereby allowing the pliant layer to relax and the air gap to return to its original state. The control circuit can then again begin monitoring for the next user input.

In one or more embodiments, the user interface is configured as a keypad that can use mechanical pressure and inductive sensing to determine user input. The same inductive circuit, operable with a pliant layer, can then be driven by discharging stored energy into the circuit to deliver haptic responses to the user. Pliant materials suitable for use with the device include the thermoplastic polyurethane mentioned above, but can also include rubber, silicone, or polymer materials. The layers of the user interface can be made very thin. The user actuation targets can be configured to replicate traditional key structures, but may also take any of variety of customized shapes, including semi-spherical, triangular, rectangular, and so forth. When the "keys," which are not traditional keys but are instead defined areas disposed along the top layer, are pressed, a change in inductance is sensed. Tactile responses are then delivered by compression and release of the pliant material. Embodiments of the invention can be configured as separate peripheral devices operable with an electronic device, but can also be integrated into the main electronic device. The user interfaces described herein are simple to manufacture, provide simple user input detection, are thin, and can be used to create single keys or multi-ley keypads. Moreover, embodiments of the invention provide the same "popple" feedback that is felt with a more traditional mechanical dome structure and is lacking in many modern electronic devices.

Turning now to FIG. 1, illustrated therein is one embodiment of an electronic device 100 that includes a user interface 101 configured in accordance with one or more embodiments of the invention. The electronic device 100 can be any of a variety of devices, including mobile telephones, smart phones, palm-top computers, tablet computers, gaming devices, multimedia devices, and the like. In the illustrative embodiment of FIG. 1, the user interface 101 defines or more keys, e.g., keys 102,103,104, along a major face 105 of the electronic device 100.

As will be described in more detail below with reference to FIGS. 3 and 4, in one embodiment each key of the user interface 101 comprises a base layer, an interior layer, and a top layer. One of these layers is compressible. In one embodiment, the interior layer is compressible, although the base layer, top layer, or combinations thereof may also be compressible.

In one or more embodiments, each of the base layer, the interior layer, and the top layer comprises a magnetically permeable material. One example of a magnetically permeable material is a powdered ferrite (nickel-zinc, iron oxide, or manganese-zinc) material that is selectively integrated with the top, interior, and base layers. Other magnetically permeable materials suitable for use with embodiments of the invention include mu-metal, permalloy, electrical steel, steel, nickel, platinum, or aluminum. The selectively deposited magnetically permeable material defines a path for each key through which a magnetic field may be supported.

A coil is disposed along a substrate layer. In one embodiment, the substrate layer is devoid of magnetically permeable materials and thus defines a small gap in the magnetic path defined by the magnetically permeable materials. A coil disposed along the substrate layer is configured to create a magnetic field through the path. In so doing, the coil and path define an inductance for each key.

A control device operable with the coil is then configured to detect changes in the inductance when the path is deformed. For example, as shown in FIG. 1, a user 106 is placing his finger 107 against a key 108. This causes the compressible layer to slightly compress, thereby changing the shape, length, or combinations thereof, of the path. The control device compares the change in inductance to a threshold to filter out noise signals. Where the change is greater than a predetermined threshold, such as greater than 1-2 mH, the control device concludes that the user 106 has affirmatively delivered input to the user interface 101. Accordingly, the control device discharges an energy storage device, which is operable with the coil, into the coil.

This discharge energizes the path, effectively causing it to function as an electromagnet. The air gap corresponding to the key 108 is then compressed when the flux applied to the path causes the top magnetically permeable material to be attracted toward the coil. This causes the key 108 to "close" by compressing the compressible material. The closing of the key 108 causes an initial haptic response 109 to be delivered to the user's finger 107. The key 108 then is released when the flux from the coil ceases. The attraction of the magnetically permeable material ceases and the key "opens." A "popple" response is thus created by the closing and opening of the key 108.

Figure 2:
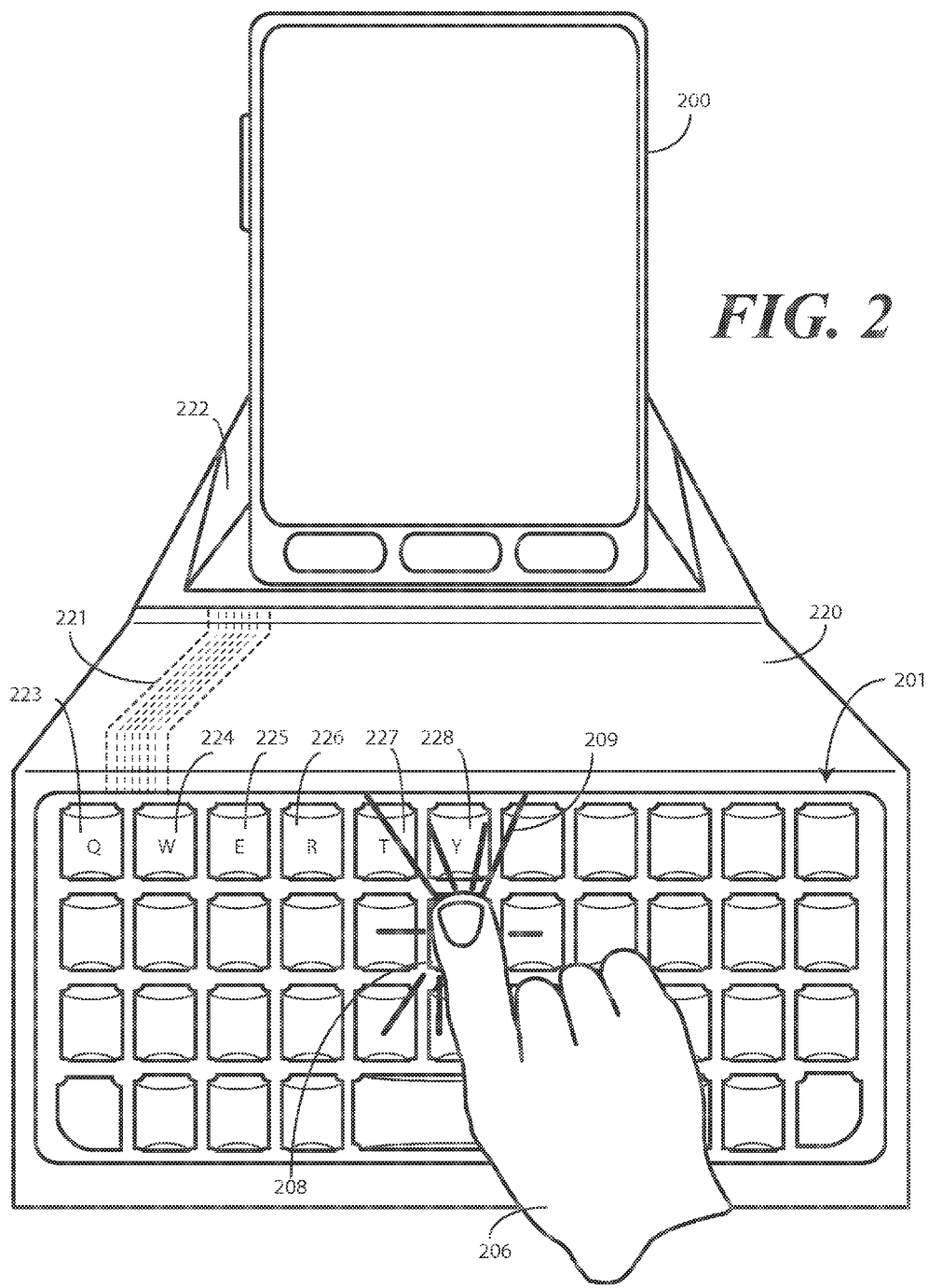
FIG. 2 illustrates one embodiment of an interface peripheral in operation with an electronic device, the interface peripheral having an explanatory user input device configured in accordance with one or more embodiments of the invention.

Turning now to FIG. 2, illustrated therein is another user interface 201 disposed within an interface peripheral 220 configured in accordance with one or more embodiments of the invention. As shown in FIG. 2, the interface peripheral 220 is operating in tandem with an electronic device 200. The user interface 201 of FIG. 2 is constructed much like the user interface (101) of FIG. 1, in that it includes a top layer, a base layer, and an interior layer disposed between the top layer and the base layer. Further, each of the top layer, the base layer, and the interior layer comprise a magnetically permeable material, and at least one of the top layer, the base layer, or the interior layer comprises a pliant material. A substrate layer is disposed between the top layer and the base layer. The substrate layer comprises an electrical conductor defining a coil corresponding to each key. A control unit is operable with the coil and an energy storage device. The control unit is configured to detect a change in inductance when the pliant material is compressed as a result of a user 206 applying force to a user input element 208. Where the change is greater than a predefined threshold, the control unit is configured to discharge the energy storage device into the coil to provide a haptic feedback 209 to the user 206 from the user interface 201.

The explanatory interface peripheral 220 of FIG. 2 is configured as a folio, with the folio serving as a housing for both the user interface 201 and the electronic device 200. A folio configuration is but one configuration suitable for user interfaces configured in accordance with embodiments of the invention, as others will be readily apparent to those of ordinary skill in the art having the benefit of this disclosure as well. Illustrating by example, the interface peripheral 220 could be configured as a stand-alone device that communicates with the electronic device 200 via wireless communication, such as a wireless keypad.

In this illustrative embodiment, a bus 221 conveys electronic signals between the electronic device 200 and the user interface 201. The folio configuration shown in FIG. 2 includes a dock 222 configured to couple to the electronic device 200. Folio configurations are convenient peripheral uses for the user interfaces described herein, as the folio can be configured to retain both the user interface 201 and the electronic device 200 within the confines of the folio. Further, the folio provides the user a choice of whether to use the user interface 201, or alternatively to detach the electronic device 200 from the folio and use the user interface disposed on the electronic device 200. Further, the user 206 can simply unfold the folio to use the user interface 201 and electronic device 200, while folding the folio results in both devices being contained within the outer folio layer, thus protecting the user interface 201 and electronic device 200 from outside debris.

A plurality of user input elements, e.g., user input elements 223, 224, 225, 226, 227, 228, are disposed along a major face 205 of the interface peripheral 220. Each user input element 223, 224, 225, 226, 227, 228 is slightly moveable along a first axis due to the inclusion of the compressible layer in the layered structure of the user interface 201. In this illustrative embodiment, the interface peripheral 220 is configured as a QWERTY keypad, with each user input element 223, 224, 225, 226, 227, 228 being configured as a key. Other configurations, including a musical keyboard, gaming keyboard, or learning keyboard, will be obvious to those of ordinary skill in the art having the benefit of this disclosure.

The control unit initially polls each user input element 223, 224, 225, 226, 227, 228 to check whether an electrical parameter changes. In one embodiment, the electrical parameter is inductance. However, other electrical parameters can be used, including resistance, current, capacitance, voltage, and so forth.

The user 206 actuates one or more of the user input elements 223, 224, 225, 226, 227, 228 by applying pressure thereto, thus moving a selected user input element 208 along the first axis. Sufficient movement of the user input element 208 along the first axis causes a change in electrical parameter to be sensed by the control unit. The actuation by the user 206 also causes the volume of an air gap disposed beneath the user input element 208 to reduce. Once this reduction exceeds a predetermined threshold, the control unit recognizes the user input as a "key event." At this point, the effective electromagnet created by the magnetically permeable material and the coil is energized by discharging an energy storage device into the coil. This causes user input element 208 to accelerate along the first axis, thereby causing the user input element 208 to "close." This causes the first "popple" effect, which is illustrated as haptic feedback 209 in FIG. 2. Following this, the effective electromagnet defined by the magnetically permeable material and the coil is de-energized, thereby releasing the user input element 208. The user input element 208 then accelerates in the negative direction along the first axis in response to the relaxation of the compressible material to return to its normally open position. This simulates the "popple" effect, which forms an additional portion of haptic feedback 209.

Figure 3:
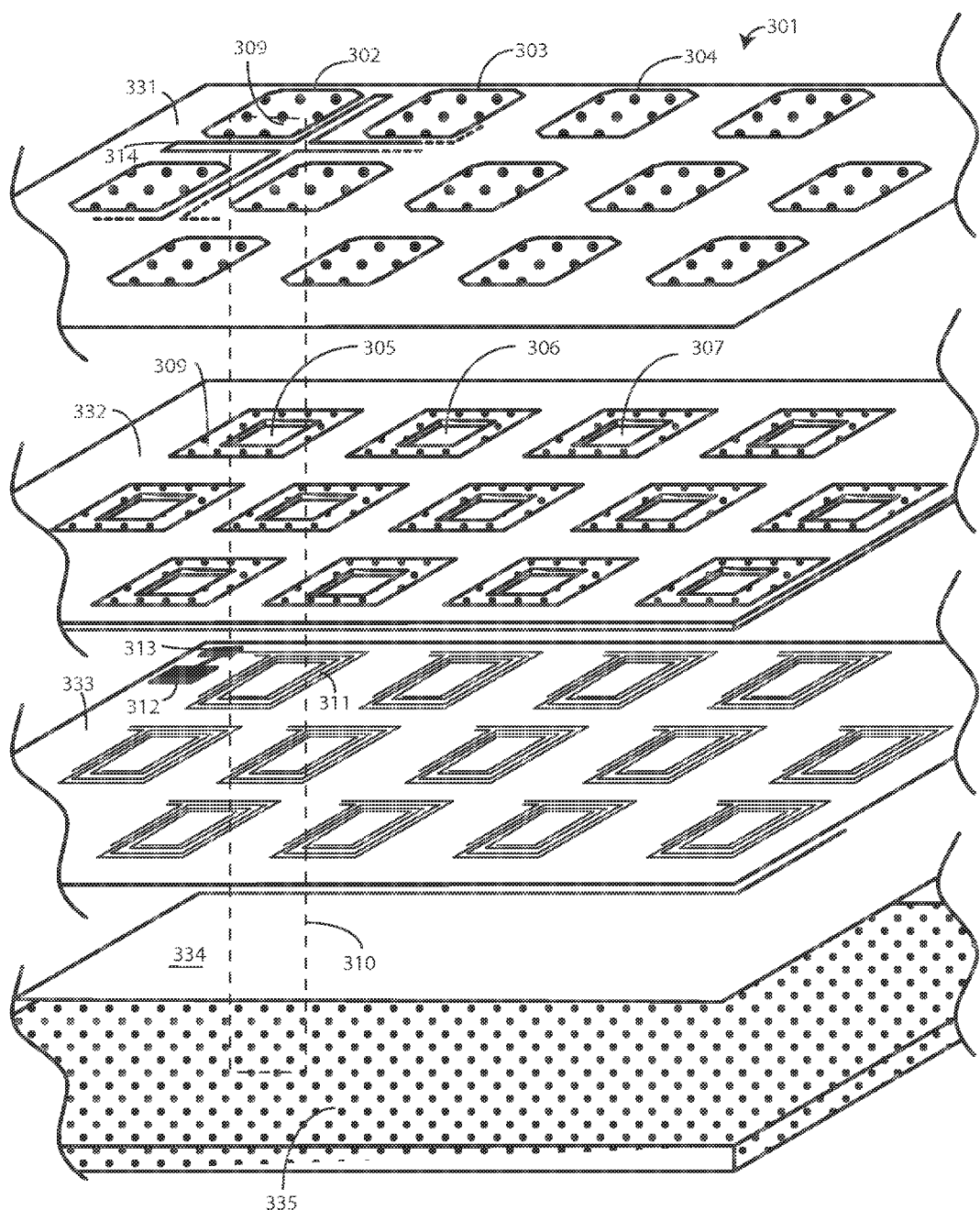
FIG. 3 illustrates an exploded view of one explanatory user interface configured in accordance with one or more embodiments of the invention.

Turning now to FIG. 3, illustrated therein is an exploded view of one explanatory user interface 301 configured in accordance with one or more embodiments of the invention.

The user interface 301 of FIG. 3 comprises a structure having one or more layers that are stacked vertically to form the overall user interface 301. The user interface 301 of FIG. 3 has been built and tested in the lab, and delivers a realistic and satisfying tactile feedback while remaining very thin in construction.

The illustrative user interface 301 of FIG. 3 includes a top layer 331 and a base layer 335. The top layer 331 defines one or more keys 302,303,304 and can be rigid or flexible. For example, in an embodiment that was experimentally tested in the lab, the top layer 331 was manufactured from thin steel. Other materials, including plastics, films, pliant materials, rubbers, and so forth, could be used for the top layer 331 as well. To provide motion between the various keys 302,303, 304, one or more optional apertures 314 may be placed between the keys 302,303,304.

The base layer 335, in one embodiment, is manufactured from a rigid material. Using a rigid material provides mechanical support for the overall user interface 301. While a rigid material is preferred in some applications, it will be clear to those of ordinary skill in the art having the benefit of this disclosure that other applications may prefer a soft, flexible, or pliant material be used for the base layer 335.

In this illustrative embodiment, the base layer 335 comprises a magnetically permeable material. Magnetically permeable material is indicated by the dotted portions of FIG. 3. In one embodiment, the magnetically permeable material is ferrite. Accordingly, the base layer 335 of FIG. 3 can be formed by a solid layer of ferrite material. While a solid ferrite layer is one suitable base layer 335, ferrite or other magnetically permeable segments corresponding to each key 302, 303,304 could be integrated into another material, such as a plastic layer, to form an alternate base layer 335. Moreover, the base layer 335 may be manufactured from plastic, with ferrite or other magnetically permeable segments corresponding to each key being integrated therein. Such an embodiment will be shown in FIG. 4 below.

Disposed between the top layer 331 and the base layer 335 is an interior layer 332. In one or more embodiments, at least one of the base layer 335, the top layer 331, and the interior layer 332 will be manufactured from a pliant material and will, accordingly, be compressible. If a soft, rubbery-feeling user interface is desired, the top layer 331 can be pliable for example. Similarly, if the user interface 301 is configured as a stand-alone device with a pigtail connector for coupling to an electronic device, a no-skid base layer may be desired. In such an application, the base layer 335 can be pliant. Of course, combinations of layers could be pliant as well.

In the illustrative embodiment of FIG. 3, the interior layer 332 is pliant and the top layer 331 and base layer 335 are both rigid. The interior layer 332 of FIG. 3 is made from thermoplastic polyurethane. However, other pliant materials for the intermediate layer could be substituted as noted above.

The illustrative interior layer 332 of FIG. 3 defines one or more air gaps 305,306,307 that correspond to the keys 302, 303,304. In this embodiment, a single air gap corresponds to a single key. For example, air gap 305 corresponds to key 302. In other embodiments, multiple air gaps will correspond to a single key. For example, rather than having a single air gap 306 disposed beneath it, key 303 may have a group of air gaps disposed beneath it.

In this illustrative embodiment, the air gaps 305,306,307 are created by apertures formed within the interior layer 332. The air gaps 305,306,307 could alternatively be formed by sealed bubbles disposed beneath the keys 302,303,304. As will be shown in FIG. 4 below, the air gaps 305,306,307 need not be formed by the interior layer 332. Other layers can form the air gaps 305,306,307 as well. Accordingly, any of the top layer 331, the interior layer 332, the base layer 335, or the other layers can define the air gaps 305,306,307.

In the illustrative embodiment of FIG. 3, both the top layer 331 and the interior layer 332 comprise selectively deposited magnetically permeable materials 308,309. For example, the keys 302,303,304 defined along the top layer 331 can be formed by integrating magnetically permeable material 308 into the top layer 331 to define key 302. In one or more embodiments, the magnetically permeable material 308 in the top layer 331 defines an electromagnet corresponding to each key 302,303,304. This can be accomplished, in one embodiment, by incorporating ferrous material into the magnetically permeable material.

Similarly, magnetically permeable material 309 can be integrated into the interior layer 332 as well. In this illustrative embodiment, the magnetically permeable material 309 integrated into the interior layer 332 circumscribes a corresponding aperture defining air gap 305.

When the layers are stacked together, the magnetically permeable materials define closed paths capable of supporting magnetic fields therein. For example, when the interior layer 332 is set between the top layer 331 and the base layer 335, the magnetically permeable material 308 in the top layer 331 defining key 302, the magnetically permeable material 309 circumscribing air gap 305 in the interior layer 332, and the ferrite in the base layer 335 form a closed loop 310 capable of supporting a magnetic field.

The magnetic field can be induced, in one embodiment, by a coil 311 disposed on a substrate layer 333 that is disposed between the top layer 331 and the base layer 335. In one embodiment, coils correspond to keys on a one-to-one basis. For example, as shown in FIG. 3, coil 311 corresponds only to key 302. However, in other embodiments, each key can correspond to multiple coils.

In one or more embodiments, the substrate layer 333 is a flexible circuit layer, such as a layer of Kapton.sup.™ having electrical conductors configured as traces disposed thereon. Note that in one or more embodiments, the substrate layer 333 is devoid of any magnetically permeable materials. As such, the disposition of the substrate layer 333 between the base layer 335 and the top layer 331 creates a gap in the closed loop 310. Experimental testing has shown that the slight gap introduced into the closed loop 310 does not significantly introduce any magnetic reluctivity into the closed loop 310. The closed loop 310 of magnetically permeable materials of the various layers and the coil 311 define an inductance.

A control unit 312 is operable both with the coil 311 and an energy storage device 313. The control unit 312 can be a microprocessor, programmable logic, application specific integrated circuit device, or other similar device. The control unit 312 is capable of executing program instructions, such as those shown in the method of FIG. 10. The program instructions may be stored either in the control unit 312 or in a memory (not shown) or other computer readable medium operable with the control unit 312.

In one embodiment, the energy storage device 313 is a capacitor. However, it will be obvious to those of ordinary skill in the art that other devices may be used as energy storage device 313. For example, in one embodiment, the energy storage device 313 comprises a rechargeable electrochemical cell. In another embodiment, the energy storage device 313 comprises a supercapacitor.

In one or more embodiments, the energy storage device 313 is considered to be "selectively" operable with the coil 311 in that the control unit 312 can selectively couple the energy storage device 313 to the coil 311 via a switch. This will be described in more detail with reference to FIGS. 5-7.

In one embodiment, each coil 311 has a corresponding energy storage device 313. In other embodiments, one energy storage device is operable with multiple coils. In yet other embodiments, all coils are operable with a single energy storage device. The choice will be left to the designer depending upon application, cost, and desired performance. Said generally, in one embodiment the energy devices correspond to coils on a one-to-one basis, while in other embodiments multiple coils correspond to a single energy storage device.

In one embodiment, an optional adhesive layer 334 is disposed between the substrate layer 333 and the base layer 335. The adhesive layer 334, which can be a double-sided layer, works to keep the alignment of the substrate layer 333 between the interior layer 332 and the base layer 335. Multiple adhesive layers can be used between the various layers in some embodiments, Note also that while the substrate layer 333 is illustrated in FIG. 3 as being beneath the interior layer 332, they could be in a different order without compromising performance.

When a user presses on a key 302,303,304, this causes the pliant material, which in this case is the interior layer 332, to compress. This reduces the corresponding air gap 305 and causes a change in the length of the closed loop 310. The compression of the pliant material thus causes the inductance defined by the closed loop 310 and the coil 311 to change. The control unit 312 detects this change and compares it to a threshold. If the change is greater than the predetermined threshold, the control unit 312 discharges the energy storage device 313 into the coil by closing a switch. As explained above, this discharge causes the magnetically permeable material 308 of the top layer 331 to be drawn toward the base layer 335. Accordingly, the magnetically permeable material 308 of the top layer 331 further compresses the pliant layer and further reduces the corresponding air gap 305 when the energy storage device 313 is discharged into the coil 311. This provides a satisfying tactile feeling to a user. After the energy storage device 313 has been discharged into the coil 311, the pliant layer is configured to relax, thereby returning key 302 to its original location.

Figure 4:
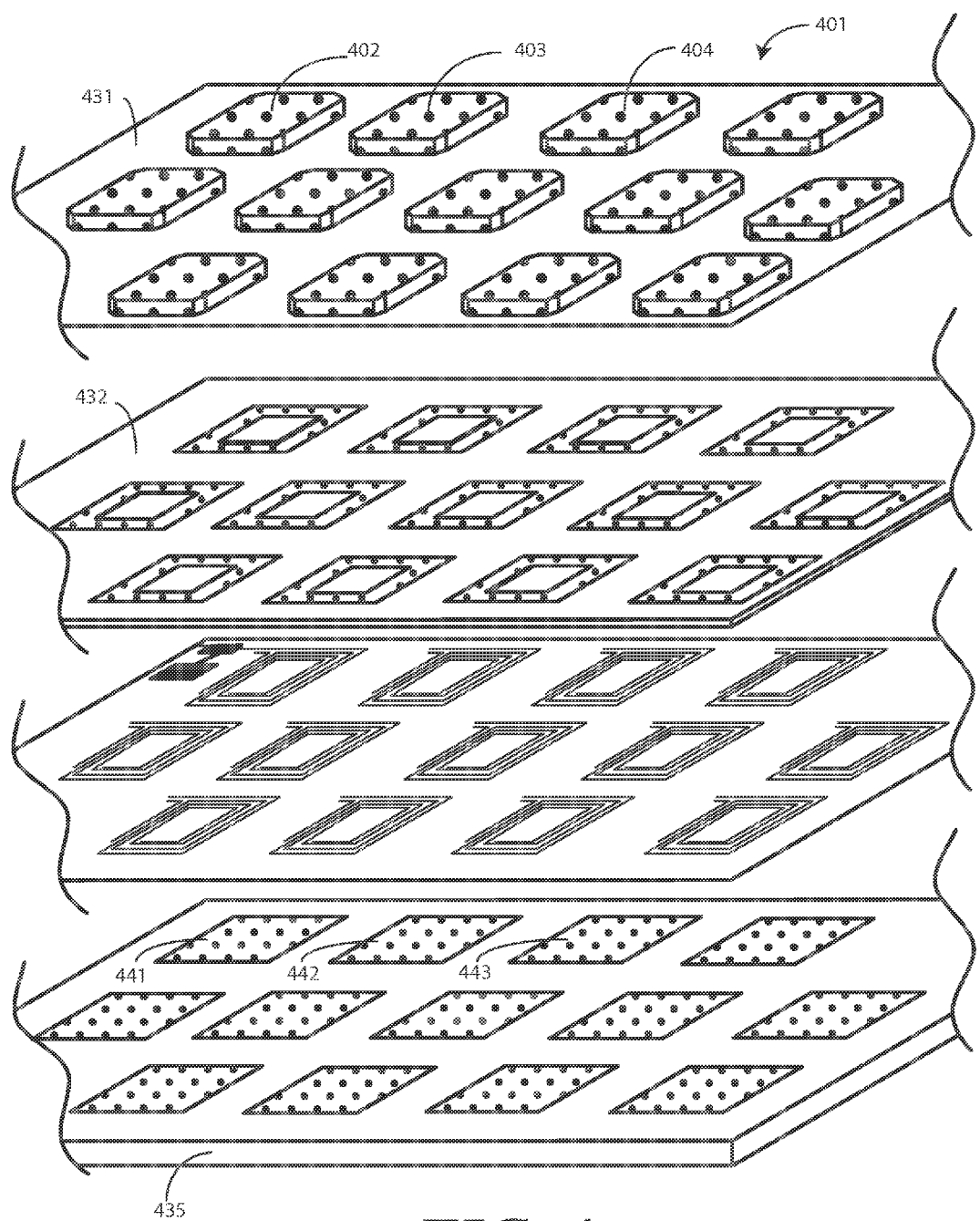
FIG. 4 illustrates an exploded view of another explanatory user interface configured in accordance with one or more embodiments of the invention.

Turning now to FIG. 4, illustrated therein is an exploded view of an alternate user interface 401 configured in accordance with one or more embodiments of the invention. The user interface 401 of FIG. 4 is similar to the user interface (301) of FIG. 3, and comprises a layered structure that are stacked vertically to form the user interface 401.

As with FIG. 3, the illustrative user interface 401 of FIG. 4 includes a top layer 431, a base layer 435, and an interior layer 432. The top layer 431 defines one or more keys 402,403,404. However, rather than being flat as in FIG. 3, the keys 402,403,404 of FIG. 4 are configured as raised elements. Accordingly, it is the top layer 431, not the interior layer 432, that defines the air gaps beneath each key 402,403,404. This illustrative embodiment is shown to demonstrate that any of the various layers can be configured to be pliant or to define air gaps in accordance with embodiments of the invention.

Since the top layer 431 defines the various air gaps, the interior layer 432 of this illustrative embodiment need not include apertures. However, apertures can be included to create air gaps having larger volumes.

Another difference between the user interface 401 of FIG. 4 and that of FIG. 3 involves the base layer 435. While the base layer (335) of FIG. 3 was uniformly magnetically permeable, in the embodiment of FIG. 4 the base layer 435 has magnetically permeable material defining magnetically permeable segments 441,442,443 that correspond to each key 402,403,404. For example, ferrite or other magnetically permeable materials can be integrated into another material, such as a plastic layer, to form the magnetically permeable segments 441,442,443. The function of the user interface 401 of FIG. 4 is substantially the same as that of FIG. 3.

Figure 5:
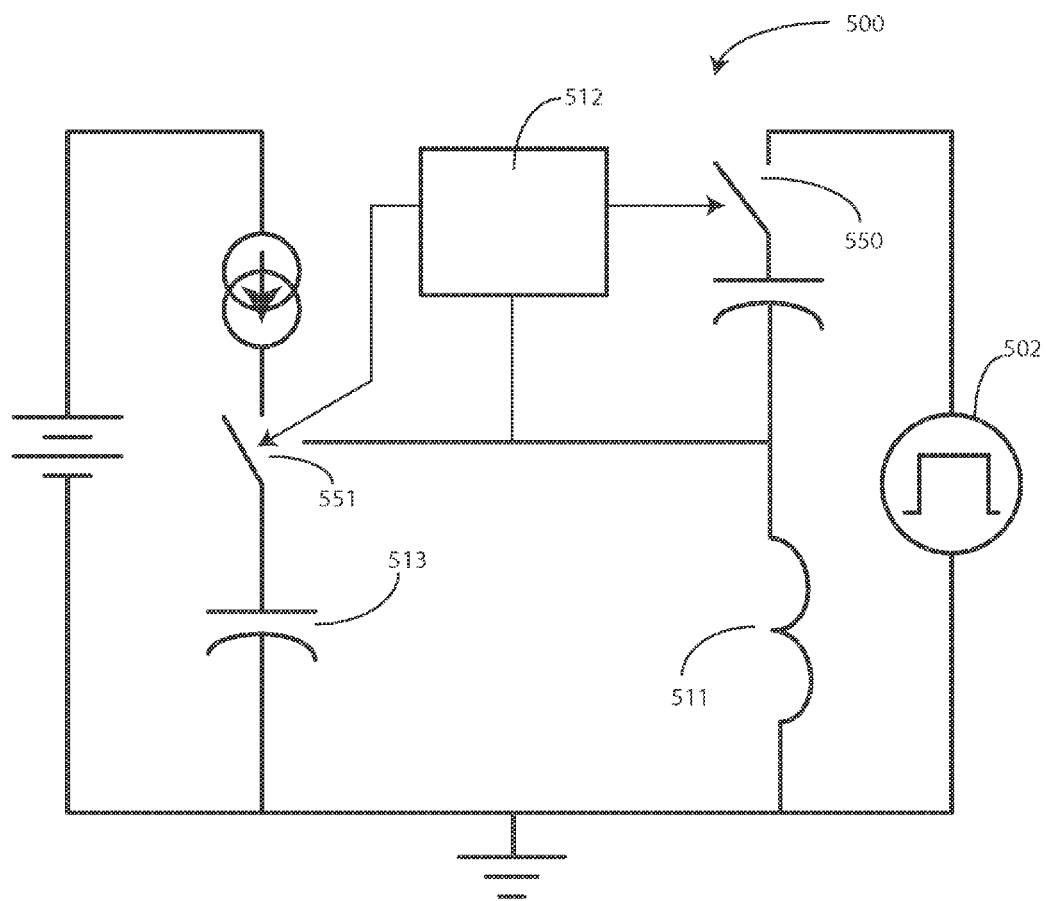
FIG. 5 illustrates one explanatory circuit operable with a user interface configured in accordance with one or more embodiments of the invention.

Turning now to FIG. 5, illustrated therein is a schematic diagram of one explanatory circuit 500 suitable use in a user interface configured in accordance with one or more embodiments of the invention. Many of the components, including the control circuit 512, the energy storage device 513, the coil 511, and the key 502 corresponding to the coil 511 have already been described. FIG. 5 shows the remaining pieces to better provide an illustration of how one or more of the embodiments operate.

Figure 6:
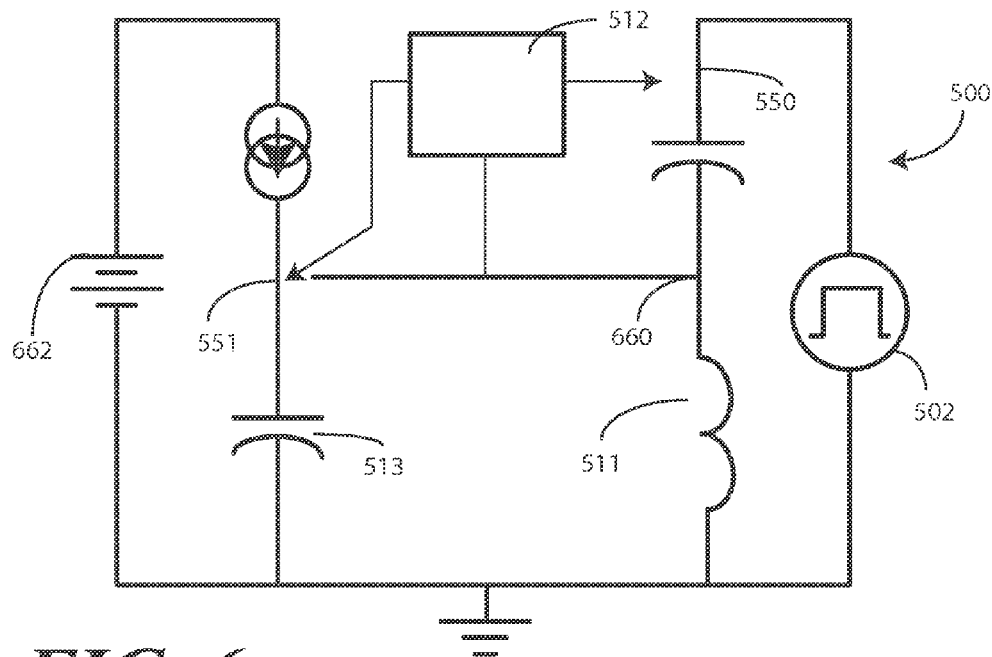
FIG. 6 illustrates one explanatory circuit configured in accordance with one or more embodiments of the invention, operable with a user interface, and configured in a sensing mode.

The control circuit 512 is operable with one or more switches 550,551. Switch 550 can be closed such than an L-C circuit including the coil 511 and the key 502 are coupled in series. The inductance of this L-C circuit is defined by the magnetically permeable material and the coil 511, with the capacitance representing parasitic capacitance of the user interfaces described above. As shown in FIG. 6, the control circuit 512 closes this switch 550 to enter a monitoring mode. In the monitoring mode, user input being applied to the key 502 changes the electrical parameters of the L-C circuit. The control circuit 512 can detect these changes through a sense node 660. Where the changes exceed a predetermined threshold, the control circuit 512 concludes that user input has been applied.

The second switch 551 can be selectively closed to charge the energy storage device 513. For example, in this explanatory circuit 500, a rechargeable cell 662 applies a current to the energy storage device 513 to keep it charged.

Figure 7:
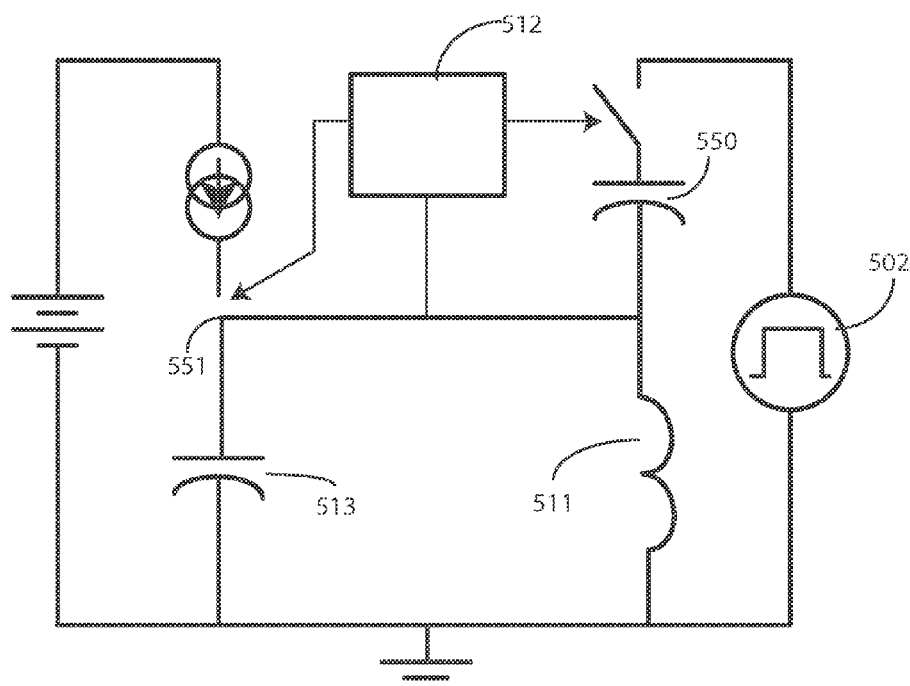
FIG. 7 illustrates one explanatory circuit configured in accordance with one or more embodiments of the invention, operable with a user interface, and configured in a driving mode.

When user input is detected, the circuit 500 enters its drive mode, which is shown in FIG. 7. Turning to FIG. 7, the control circuit 512 has opened switch 550 and has actuated switch 551 such that the energy storage device 513 discharges into the coil 511. This discharge causes the key 502 to simulate a popple tactile response as described above. Once the tactile response is produced, the control circuit 512 can return switch 551 to the state charging the energy storage device 513 and can again close switch 550 to enter the monitoring mode shown in FIG. 6.

Figure 8:
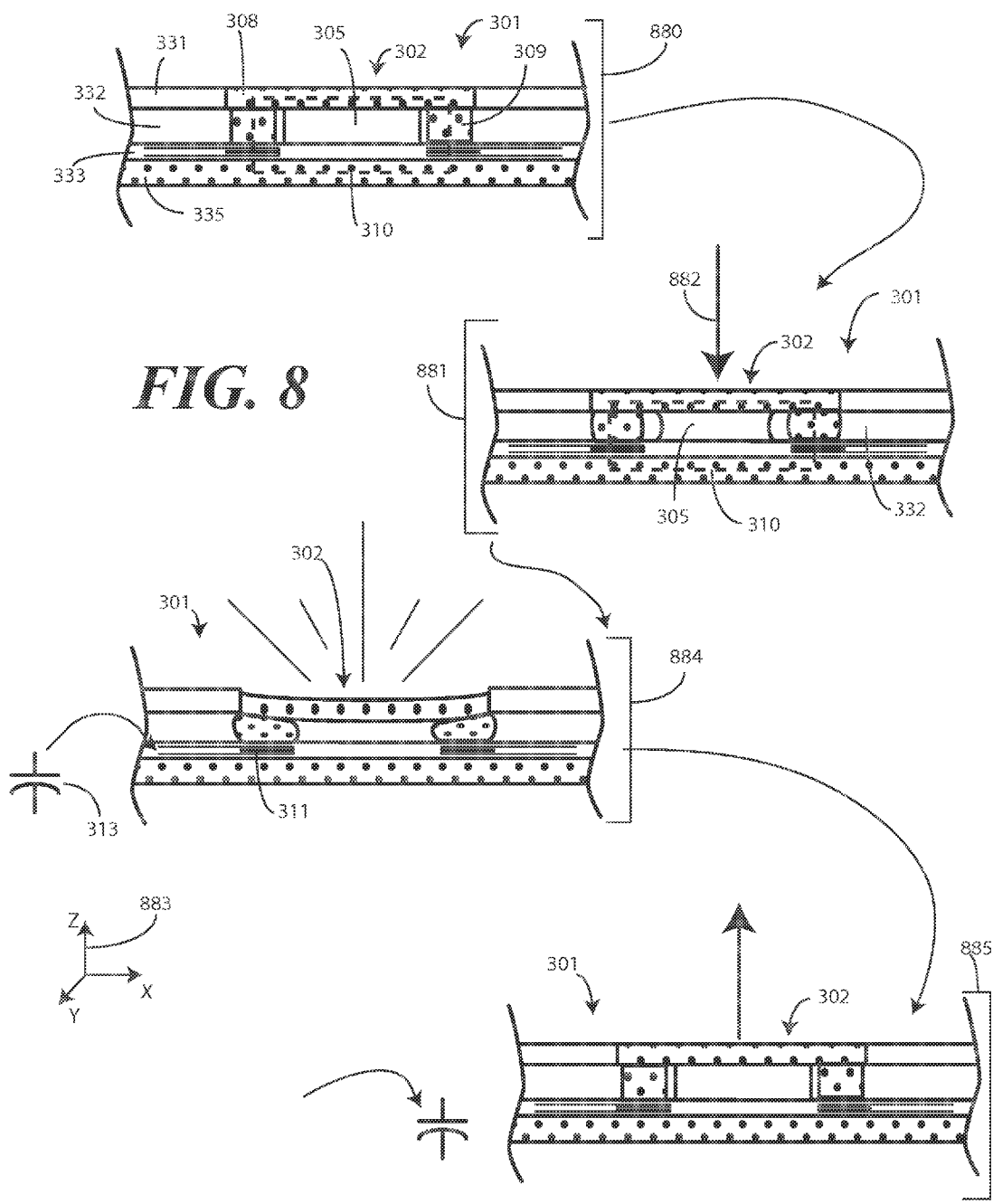
FIG. 8 illustrates a sectional view of one explanatory user interface configured in accordance with one or more embodiments of the invention.

Turning now to FIG. 8, illustrated therein is a sectional view of the user interface 301 of FIG. 3 that illustrates the mechanical action occurring in accordance with one or more embodiments of the invention. The user interface 301 of FIG. 3 is being used for explanatory purposes only.

At step 880, a key 302 of the user interface 301 is in a non-actuated state. The top layer 331 sits adjacent to the interior layer 332, which is adjacent to the substrate layer 333. The base layer 335 is also adjacent to the substrate layer 333. Magnetically permeable materials 308,309 in the top layer 331 and interior layer 332, working in tandem with the magnetically permeable base layer 335, define the closed loop 310. An air gap 305 is disposed beneath the key 302.

At step 881, a force 882 is applied to the user interaction surface of the key 302. The force 882 translates the user interaction surface of the key 302 along the z-axis 883 (in the negative direction). This translation compresses the pliant material of the interior layer 332, reduces the volume of the air gap 305 and changes the length of the closed loop 310. This change alters the electrical properties of the closed loop, which can be sensed by a control device.

At step 884, the energy storage device 313 is discharged into the coil 311. The ferrous material integrated with the magnetically permeable material 308 forms an electromagnet in the top layer 331. At this step 884, the electromagnet is energized and accelerates the key 302 downwards, causing the key to "close." At step 885, the electromagnet will be de-energized and will no longer hold down the key 302. The key 302 will accelerate upwards to return to its normally open position, shown at step 880. This simulates the popple effect where the key is released.

Figure 9:
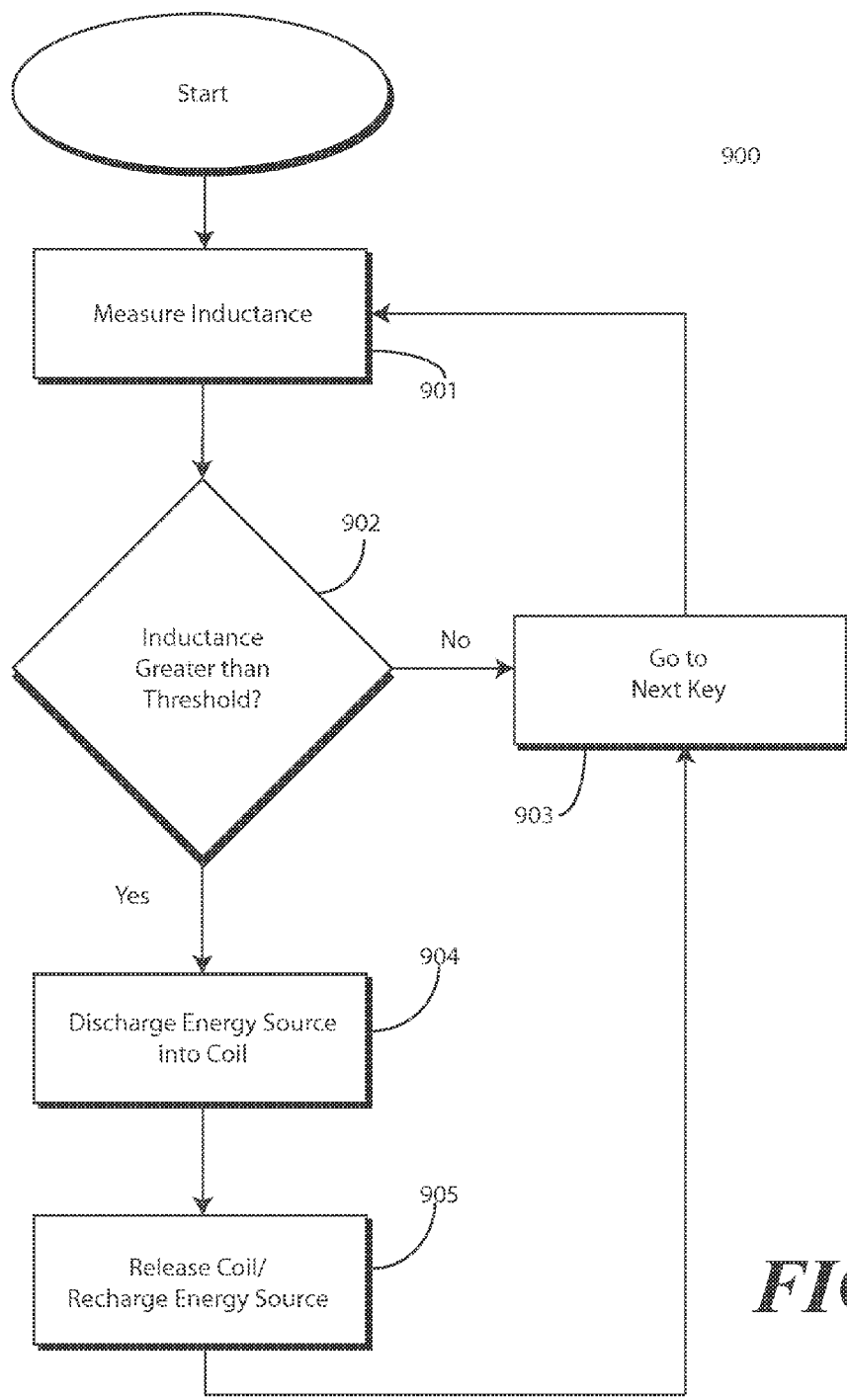
FIG. 9 illustrates one explanatory method of operating a user interface in accordance with one or more embodiments of the invention.

Turning now to FIG. 9, illustrated therein is a method 900 of detecting user input with a user input device configured in accordance with one or more embodiments of the invention. The steps of FIG. 9 have largely been described above, and thus will only cursorily be described here, as the function and operation occurring in the devices above serve to form steps of the method 900 that need not be repeated. In one or more embodiments, the method 900 is suitable for execution by a control device.

At step 901, the method 900 detects a change in an inductance defined by a key structure comprising a plurality of layers. Each key can comprise a magnetically permeable material and a coil. The change in inductance is due, in one or more embodiments, to a pliant layer compressing in response to user input, thereby changing the electrical properties of an L-C circuit formed by the coil and the magnetically permeable materials.

At decision 902, the method 900 compares the change detected to a predetermined threshold. Where the change is less than the predetermined threshold, the method continues monitoring at step 903. In one embodiment, the various keys are monitored serially. Accordingly, step 903 can include monitoring the next key.

Where the change is greater than the predetermined threshold, the method discharges an energy storage device into the coil at step 904. In one or more embodiments, this step 904 comprises selectively actuate a switch coupled between the energy storage device and the coil to discharge the energy storage device into the coil. This discharge causes a pliant layer of the plurality of layers forming the key corresponding to the coil to compress.

At step 905, the method 900 stops discharge of the energy storage device into the coil, thereby causing the pliant layer to decompress or relax. In one embodiment, step 905 simply comprises allowing the energy storage device to fully discharge. In another embodiment, step 904 comprises opening a switch to stop the discharge. Step 904 can optionally include recharging the energy storage device after the discharging. Once step 904 is complete, the method continues monitoring by returning to step 901.

In the foregoing specification, specific embodiments of the present invention have been described. However, one of ordinary skill in the art appreciates that various modifications and changes can be made without departing from the scope of the present invention as set forth in the claims below. Thus, while preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

What is claimed is:

1. A peripheral electronic device coupled to another electronic device, the peripheral electronic device comprising:
   a user interface defining one or more keys along a major face, wherein each key comprises:
      a base layer, an interior layer, and a top layer, each comprising a magnetically permeable material, wherein one or more of the base layer, the interior layer, and the top layer is compressible; and
      a coil;
      wherein the coil and the magnetically permeable material define an inductance for the each key;
   an energy storage device operable with the coil;
      a control device operable with the energy storage device and configured to discharge the energy storage device into the coil when the inductance changes by at least a predetermined threshold.

2. The peripheral electronic device of claim 1, wherein the energy storage device comprises a plurality of energy storage devices corresponding to the each key on a one-to-one basis.

3. The peripheral electronic device of claim 1, wherein the interior layer comprises a thermoplastic polyurethane and defines an air gap for each key between the top layer and the base layer.

4. The peripheral electronic device of claim 1, further comprising a switch coupled between the energy storage device and the coil, wherein the control device is configured to selectively actuate the switch to discharge the energy storage device into the coil.

5. The peripheral electronic device of claim 1, wherein one of the top layer, the base layer, or the interior layer defines an air gap corresponding to the each key.

6. The peripheral electronic device of claim 1, wherein at least one of the top layer, the base layer, or the interior layer comprises a pliant material.

7. The peripheral electronic device of claim 6, wherein the magnetically permeable material of the top layer defines a magnetically permeable segment corresponding to, and defining, the each key.

8. The peripheral electronic device of claim 7, wherein the magnetically permeable segment is configured to compress the pliant material when the energy storage device is discharged into the coil.

9. The peripheral electronic device of claim 1, wherein the magnetically permeable material comprises iron oxide.

10. The peripheral electronic device of claim 1, wherein the base layer is rigid.

11. The peripheral electronic device of claim 1, wherein the energy storage device comprises a capacitor.

* * * * *